United States Patent
Kim et al.

(10) Patent No.: US 7,830,731 B2
(45) Date of Patent: *Nov. 9, 2010

(54) CIRCUIT FOR INITIALIZING A PIPE LATCH UNIT IN A SEMICONDUCTOR MEMORY DEVICE

(75) Inventors: Kyoung-Nam Kim, Kyoungki-do (KR); Ho-Youb Cho, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 53 days.

This patent is subject to a terminal disclaimer.

(21) Appl. No.: 12/260,298

(22) Filed: Oct. 29, 2008

(65) Prior Publication Data

US 2009/0063803 A1    Mar. 5, 2009

Related U.S. Application Data

(63) Continuation of application No. 11/478,123, filed on Jun. 30, 2006, now Pat. No. 7,450,440.

(30) Foreign Application Priority Data

Sep. 29, 2005   (KR) .......................... 2005-0090901
Dec. 23, 2005   (KR) .......................... 2005-0128637

(51) Int. Cl.
    *G11C 7/00*    (2006.01)
(52) U.S. Cl. ........................... 365/189.17; 365/189.05; 365/191; 365/194; 365/233.1; 711/169
(58) Field of Classification Search ........... 365/189.05, 365/189.17, 191, 194, 365.1; 711/169
See application file for complete search history.

(56) References Cited

U.S. PATENT DOCUMENTS

| | | | |
|---|---|---|---|
| 6,288,947 B1 | 9/2001 | Kim et al. | |
| 6,353,574 B1 | 3/2002 | Shim | |
| 6,724,684 B2 | 4/2004 | Kim | |
| 6,813,195 B2 | 11/2004 | Bang et al. | |
| 6,834,015 B2 | 12/2004 | Yoon | |
| 7,164,609 B2 | 1/2007 | Park | |
| 7,450,440 B2* | 11/2008 | Kim et al. ............. | 365/189.17 |
| 2005/0185484 A1 | 8/2005 | Jang et al. | |

FOREIGN PATENT DOCUMENTS

CN          1421789          6/2003

(Continued)

OTHER PUBLICATIONS

Notice of Allowance issued from Chinese Intellectual Property Office on Aug. 26, 2009.

*Primary Examiner*—Hoai V Ho
(74) *Attorney, Agent, or Firm*—IP & T Group LLP

(57) ABSTRACT

A semiconductor memory device includes a pipe latch unit having a plurality of pipe latches for latching data. An input controller controls input timing of data transmitted from data line to the pipe latch unit. An output controller controls output timing of data latched in the pipe latch unit. An initialization controller controls the input controller and the output controller to thereby initialize the pipe latch unit in response to a read/write flag signal which is activated during a write operation.

11 Claims, 11 Drawing Sheets

FOREIGN PATENT DOCUMENTS

| | | |
|---|---|---|
| CN | 1476020 | 2/2004 |
| JP | 2001-35154 A | 2/2001 |
| JP | 2001-35155 A | 2/2001 |
| JP | 2004-171738 A | 6/2004 |
| JP | 2005-235364 A | 9/2005 |
| KR | 10-2000-0044572 A | 7/2000 |
| KR | 10-2001-0004203 A | 1/2001 |
| KR | 1020040092745 A | 11/2004 |

* cited by examiner

US 7,830,731 B2

CIRCUIT FOR INITIALIZING A PIPE LATCH UNIT IN A SEMICONDUCTOR MEMORY DEVICE

RELATED APPLICATIONS

This application is a continuation of U.S. application Ser. No. 11/478,123, filed on Jun. 30, 2006, now U.S. Pat. No. 7,450,440, claiming priority of Korean Application Nos. KR 10-2005-0090901, filed on Sep. 29, 2005 and KR 10-2005-0128637, filed on Dec. 23, 2005, the entire contents of each of which are hereby incorporated by reference.

FIELD OF THE INVENTION

The present invention relates to a semiconductor memory device; and, more particularly, to a semiconductor memory device reliably operating under a high frequency condition.

DESCRIPTION OF RELATED ARTS

Generally, a double data rate (DDR2) memory device is able to receive consecutive commands, however, not capable of processing all of the commands immediately. Therefore, the DDR2 obtains time for performing the consecutive commands by delaying an activation timing of a column address strobe (CAS) signal, in response to which signal an actual operation is performed. A delay between the inputting moment of a command and the activating moment of the CAS signal is referred to as additive latency AL. A delay between the activating moment of the CAS signal and the outputting moment of valid data is referred as a CAS latency CL. For example, in case of a read operation, the DDR2 latches data stored in a cell array block to a pipe latch in response to a read command and, then, outputs the data latched in the pipe latch after the CAS latency CL. Therefore, the data can be outputted without data collision when commands are inputted consecutively.

FIG. 1 is a block diagram demonstrating a data path between a cell array block and a data pad.

In a read operation, a data stored in a unit cell 1 is loaded at a bit line pair BL and/BL. The data loaded at the bit line pair BL and/BL is amplified by the bit line sense amplifier 2 and, then, amplified once more by a data sense amplifier 3. The amplified data is stored in a pipe latch block 4 via an I/O bus and outputted to an output buffer 5 after the CAS delay CL. The data buffered in the output buffer 5 is outputted through a data pad 6. The abovementioned data flow from the data sense amplifier 3 to the output buffer 5 is referred to as a read path.

In a write operation, external data is inputted to an input buffer 7 through the data pad 6. The data in the input buffer 7 is stored in a data input register 8 and, then, transmitted to a write driver 9 through the I/O bus. The write driver 9 amplifies the data. The amplified data is transmitted to the bit line pair BL and/BL in the bit line sense amplifier 2 selected by a column selection signal YI. The data in the bit line pair BL and/BL is stored in the corresponding unit cell 1. The abovementioned data flow from the input buffer 7 to the write driver 9 is referred to as a write path.

DDR2 includes the pipe latch block 4 in the read path in order to prevent a data collision even though a plurality of read commands are consecutively inputted.

SUMMARY OF THE INVENTION

An object of the present invention to provide in a semiconductor memory device a pipe latch block that includes a plurality of pip latches for preventing data collisions when a plurality of read commands are consecutively inputted.

In accordance with an aspect of the present invention, there is provided a semiconductor memory device, including: a pipe latch unit including a plurality of pipe latches for latching data; an input controller for controlling input timing of the data transmitted from a data line to the pipe latch unit; an output controller for controlling output timing of the data latched in the pipe latch unit; and an initialization controller for controlling the input controller and the output controller to thereby initialize the pipe latch unit during a write operation.

In accordance with another aspect of the present invention, there is provided a semiconductor memory device, including: a pipe latch unit including a plurality of pipe latches for latching data; an input controller for controlling input timing of a data transmitted from the data line to the pipe latch unit; an output controller for controlling output timing of the data latched in the pipe latch unit; and an initialization controller for controlling the input controller and the output controller in response to a read/write flag signal which is activated to thereby initialize the pipe latch unit during a write operation.

The read/write flag is activated after (WL-1) clocks pass from the inputting moment of a write command and is inactivated after additive latency passes from the inputting moment of a read command, wherein the WL denotes write latency, i.e., a time delay between the inputting moment of the write command and the writing moment of valid data.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device in accordance with the present invention will be described in detail referring to the accompanying drawings.

Figure 1:
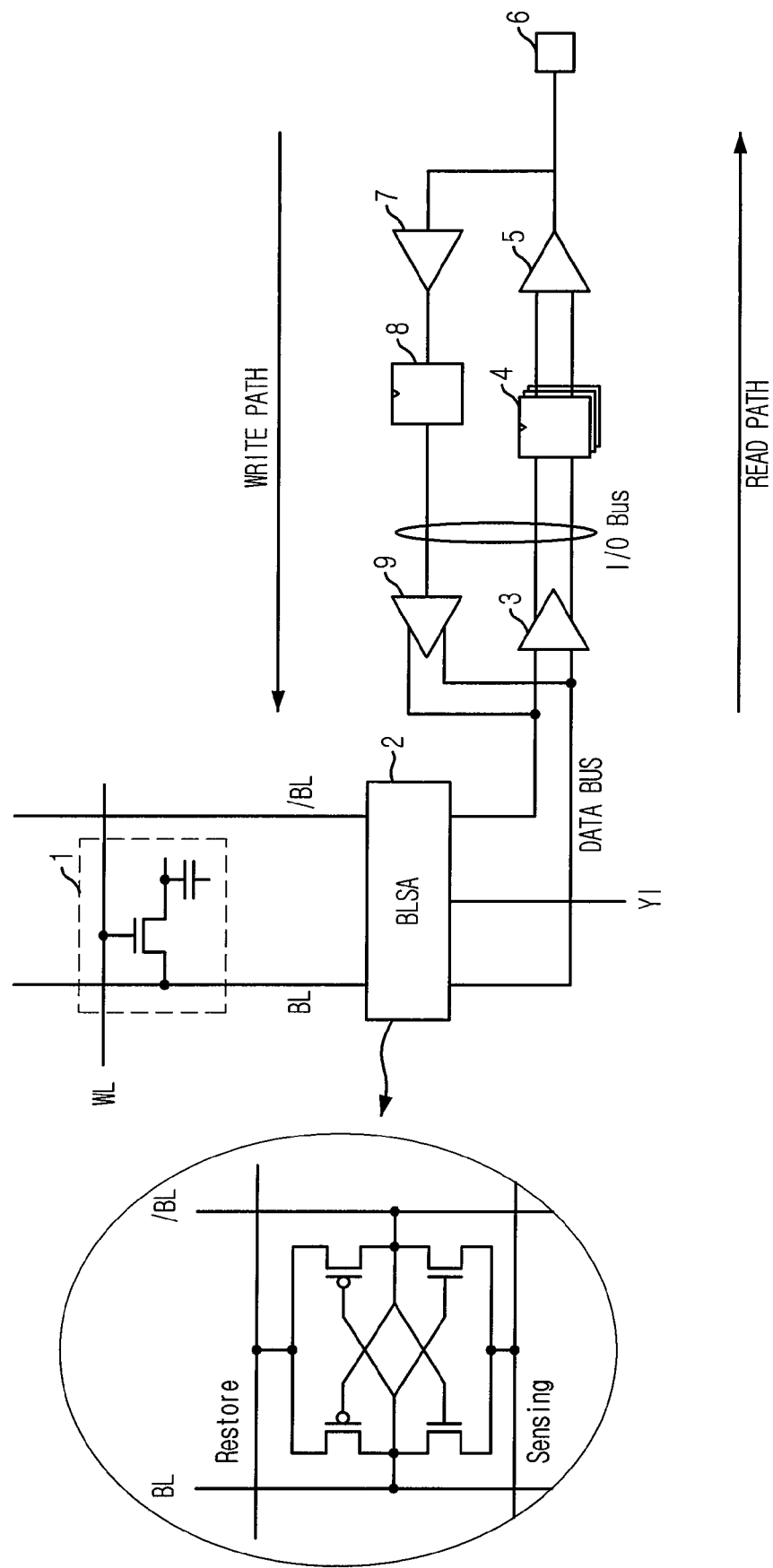
FIG. 1 is a block diagram demonstrating a data path between a cell array block and a data pad.
Figure 2:
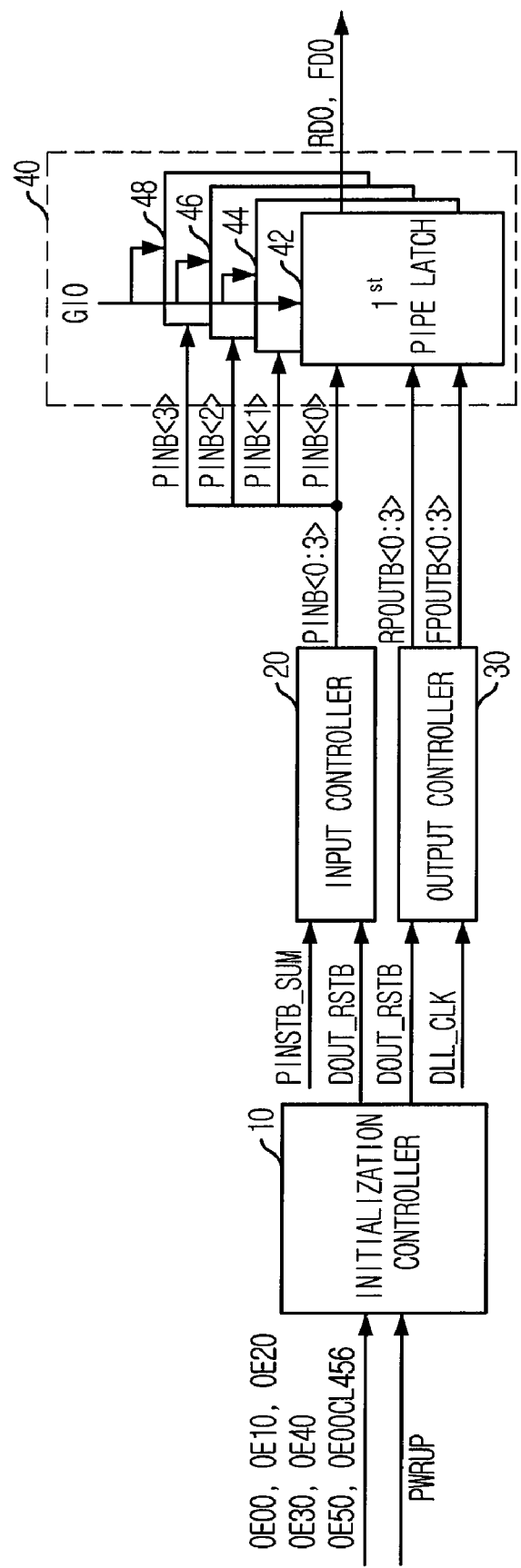
FIG. 2 is a block diagram describing a pipe latch block in accordance with an embodiment of the present invention.

FIG. 2 is a block diagram describing a pipe latch block in accordance with an embodiment of the present invention.

As shown in FIG. 2, the pipe latch block includes a pipe latch unit 40 provided with a plurality of pipe latches, e.g., a first pipe latch 42, an input controller 20 for controlling an input timing of a data transmitted from a data line GIO to the pipe latch unit 40, an output controller 30 for controlling an output timing of the data latched in the pipe latch unit 40, and an initialization controller 10 for initializing the input controller 20 and the output controller 30.

The initialization controller 10 is precluded from initializing the input controller 20 and the output controller 30 during a read operation in order to enable the pipe latch unit 40. After the read operation is terminated, the initialization controller 10 initializes the input controller 20 and the output controller 30 in order to reset the pipe latch unit 40 and prepare for a next read operation.

The initialization controller 10 detects a read operation sector in response to a plurality of output enable signals OE00 to OE00CL456 in order to output an initialization control signal DOUT_RSTB. The input controller 20 receives a column clock signal PINSTB_SUM and the initialization control signal DOUT_RSTB to sequentially activate input control signals PINB<0:3> in order to transmit data loaded at the data line GIO into the pipe latch unit 40. The output controller 30 receives a delay locked loop (DLL) clock DLL_CLK and the initialization control signal DOUT_RSTB to sequentially activate output control signals RPOUTB<0:3> or FPOUTB<0:3> in order to output the data stored in the pipe latch unit 40 as rising data or falling data. The column clock signal PINSTB_SUM is activated into a logic low level after a read command RD is inputted. The DLL clock DLL_CLK is a low active signal.

Figure 3:
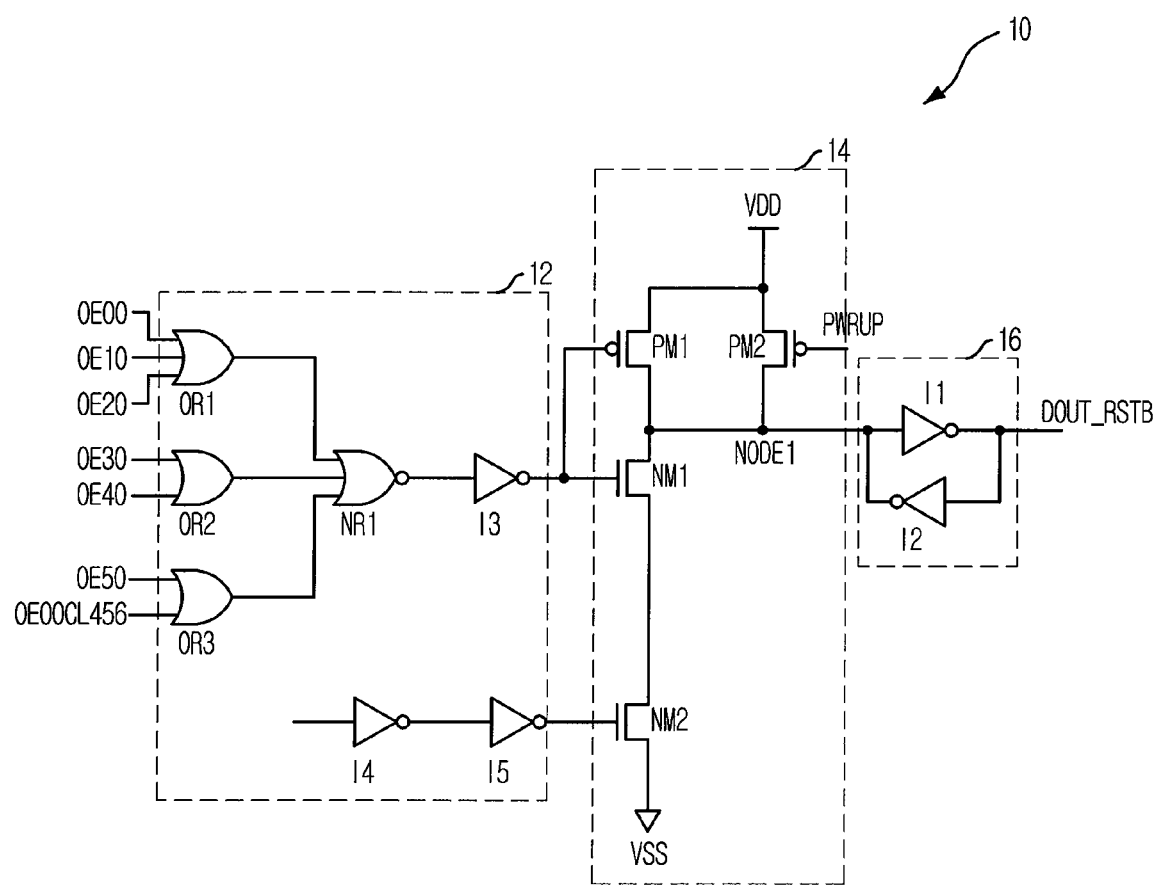
FIG. 3 is a schematic circuit diagram depicting an initialization controller shown in FIG. 2.

FIG. 3 is a schematic circuit diagram depicting the initialization controller 10 shown in FIG. 2.

As shown in FIG. 3, the initialization controller 10 includes a signal detector 12, a signal generator 14, and a latch unit 16.

The signal detector 12 receives the output enable signals OE00 to OE00CL456, detects the read operation sector, and outputs first and second detection signals. The signal generator 14 receives a power-up signal PWRUP and outputs an output signal in response to the first and the second detection signals. The latch unit 16 latches the output signal to thereby output the initialization control signal DOUT_RSTB.

The signal detector 12 is provided with three OR gates OR1 to OR3, a first NOR gate NR1, and three inverters I3 to I5. The first OR gate OR1 receives the first to the third output enable signals OE00 to OE20. The second OR gate OR2 receives the fourth and the fifth output enable signals OE30 and OE40. The third OR gate OR3 receives the sixth and the seventh output enable signals OE50 and OE00456. The first NOR gate NR1 receives outputs of the first to the third OR gates OR1 to OR3. The first inverter I3 inverts an output of the first NOR gate NR1 to thereby output the first detection signal. The second and the third inverters I4 and I5 delay the first output enable signal OE00 to thereby output the second detection signal.

The signal generator 14 includes two PMOS transistors PM1 and PM2 and two NMOS transistors NM1 and NM2. The first PMOS transistor PM1 connected between a power supply voltage VDD terminal and a first node NODE1 receives the first detection signal through its gate. The first NMOS transistor NM1 connected between the first node NODE1 and the second NMOS transistor NM2 receives the first detection signal through its gate. The second NMOS transistor NM2 connected between the first NMOS transistor NM1 and a ground voltage VSS terminal receives the second detection signal through its gate. The second PMOS transistor PM2 connected between the power supply voltage VDD terminal and the first node NODE1 receives the power-up signal PWRUP and outputs a voltage loaded at the first node NODE1 as the output signal. The power-up signal PWRUP is inactivated as a logic high level after an internal voltage, e.g., a power supply voltage VDD is stabilized.

The latch unit 16 is provided with two inverters 11 and 12 cross-coupled to each other to thereby invert the output signal of the signal generator 14 as the initialization control signal DOUT_RSTB.

Figure 4:
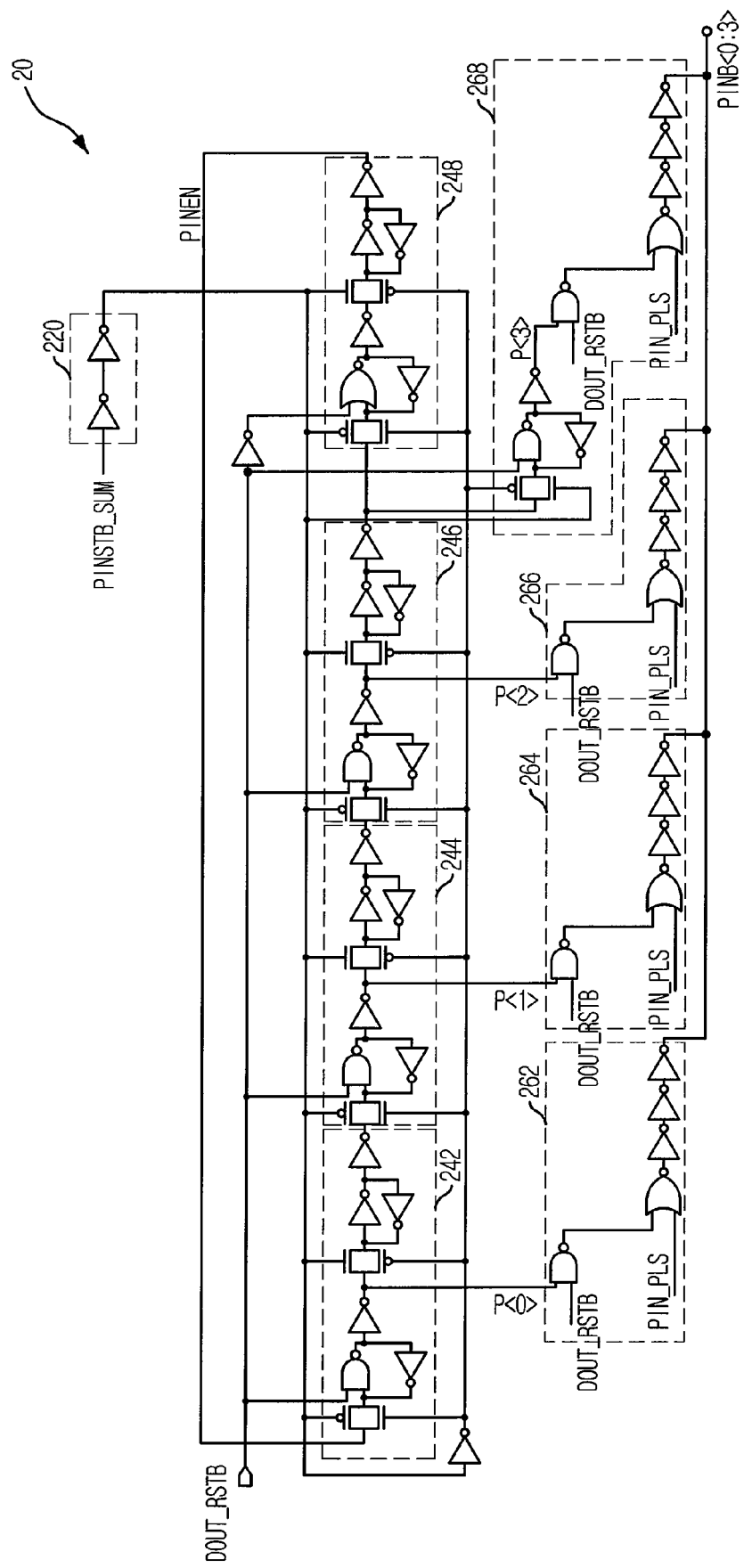
FIG. 4 is a schematic circuit diagram showing an input controller shown in FIG. 2.

FIG. 4 is a schematic circuit diagram showing the input controller 20 shown in FIG. 2.

As shown in FIG. 4, the input controller 20 includes an inverter chain 220, four latch blocks 242 to 248, and four input control signal generators 262 to 268.

The inverter chain 220 delays the column clock signal PINSTB_SUM. The first to the fourth latch blocks 242 to 248 transmit latch signals P<0:3> in response to the initialization control signal DOUT_RSTB and an output of the inverter chain 220. An output signal PINEN of the fourth latch block 248 is fed back to the first latch block 242. The first to the fourth input control signal generators 262 to 268 output the latch signals P<0:3> as input control signals PINB<0:3> in response to the initialization control signal DOUT_RSTB and a delayed column clock signal PIN_PLS. The delayed column clock signal PIN_PLS is generated by delaying the column clock signal PINSTB_SUM.

When all of the output enable signals OE00 to OE00CL456 are inactive, the initialization control signal DOUT_RSTB of a logic low level is inputted to the input controller 20. The output signal PINEN of the fourth latch block 248 has a logic high level in response to the initialization control signal DOUT_RSTB of the logic low level. Therefore, the input control signals PINB<0:3> have a logic high level. After the column clock signal PINSTB_SUM is activated into a logic low level in response to activation of a read command RD, the input control signals PINB<0:3> sequentially become a logic low level. Each pipe latch, e.g., 42, in the pipe latch unit 40 receiving the corresponding input control signal, e.g., PIB<0>, latches data loaded at the data line GIO in response to the input control signal PINB<0:3> of the logic low level.

Figure 5:
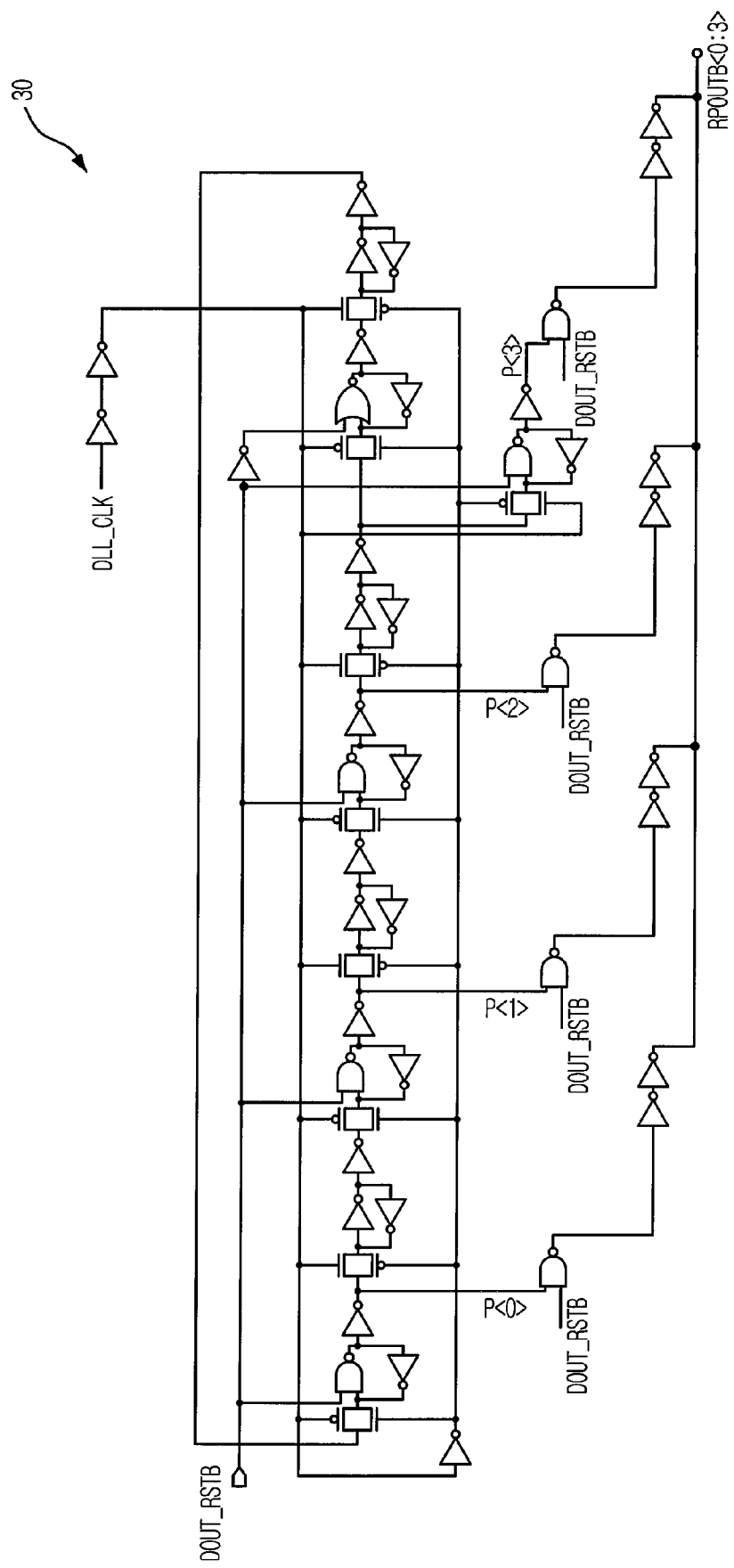
FIG. 5 is a schematic circuit diagram describing an output controller shown in FIG. 2.

FIG. 5 is a schematic circuit diagram describing the output controller 30 shown in FIG. 2.

As shown in FIG. 5, the output controller 30 includes a similar circuitry with that of the input controller 20 shown in FIG. 4. However, the output controller 30 receives a delay locked loop (DLL) clock DLL_CLK instead of the column clock signal PINSTB_SUM in order to control internal latches. The output controller 30 outputs output control signals RPOUTB<0:3> of a logic high level when the initialization control signal DOUT_RSTB is activated into a logic low level. When the DLL clock DLL_CLK is activated as a logic low level, the output control signals RPOUTB<0:3> sequentially become a logic low level. Each pipe latch, e.g., 42, in the pipe latch unit 40 receiving the corresponding output control signal, e.g., RPOUTB<0>, outputs a data stored in the first pipe latch 42 in response to the input control signal RPOUTB<0> of the logic low level.

Figure 6:
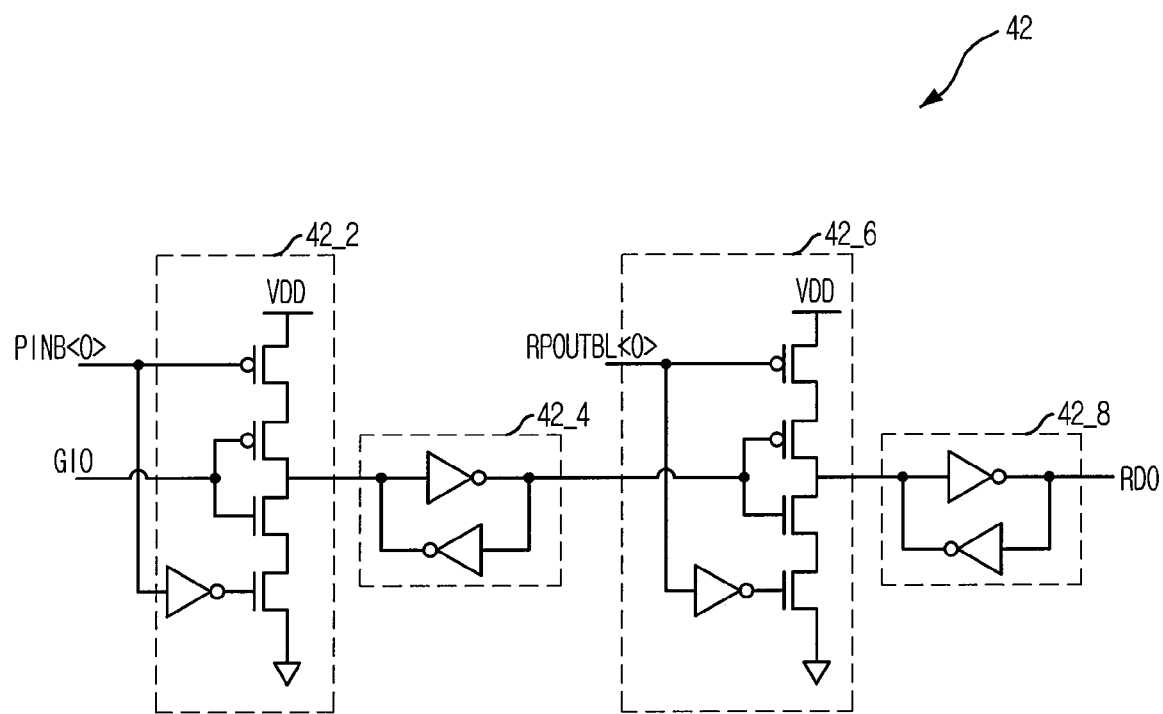
FIG. 6 is a schematic circuit diagram depicting a first pipe latch in a pipe latch unit shown in FIG. 2.

FIG. 6 is a schematic circuit diagram depicting the first pipe latch 42 in the pipe latch unit 40 shown in FIG. 2.

As shown in FIG. 6, the first pipe latch 42 includes an input block 42_2, a first latch 42_4, an output block 42_6, and a second latch 42_8. The input block 42_2 transmits the data loaded at the data line GIO in response to the first input control signal PINB<0>. The output block 42_6 transmits the data latched in the first latch 42_4 in response to the first output control signal RPOUTB<0>. The first and the second latches 42_4 and 42_8 respectively latch the data in the input block 42_2 and the output block 42. Output of the second latch 42_8 is a rising data RDO.

Although it is not mentioned, the above embodiment of the present invention further includes blocks for outputting falling data FDO. The blocks for outputting the falling data FDO have the same structure as that for outputting the rising data RDO except for receiving output control signals FPOUTB<0:3> instead of RPOUTB<0:3>.

Figure 7:
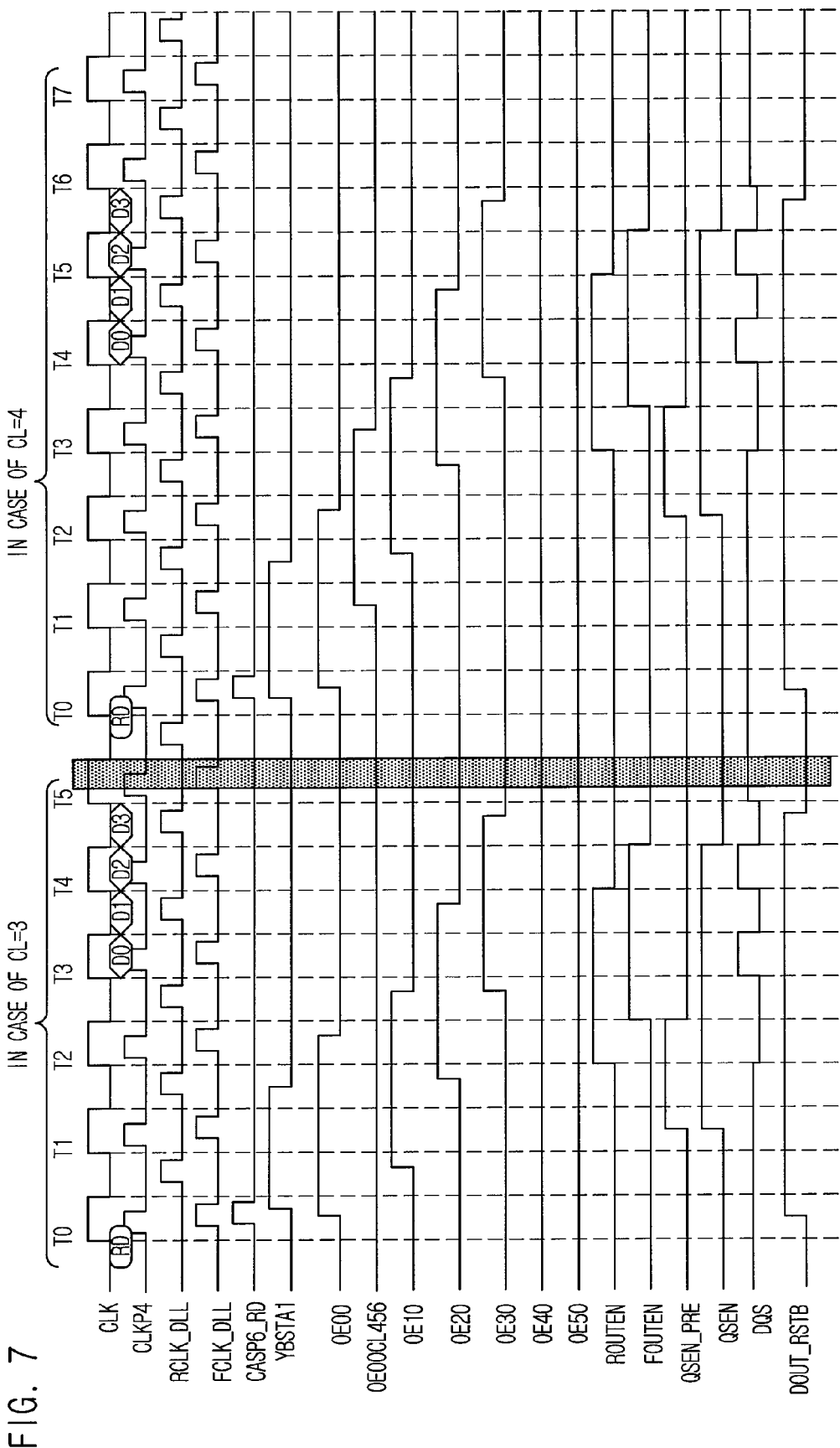
FIG. 7 is a timing diagram demonstrating an operation of an initialization controller shown in FIG. 3.

FIG. 7 is a timing diagram demonstrating an operation of the initialization controller 10 shown in FIG. 3.

At first, when all of the output enable signals OE00 to OE00CL456 are inactive, the signal detector 12 outputs the first and the second detection signals of a logic low level. Accordingly, the output signal of the signal generator 14 becomes a logic high level. The latch unit 16 inverts and latches the output signal of the signal generator 14 to thereby output the initialization control signal DOUT_RSTB of a logic low level.

After the read command RD is inputted, an internal read CAS signal CASP6_RD is activated. Consequently, the output enable signals OE00 to OE00CL456 are sequentially activated into a logic high level. When one of the output enable signals OE00 to OE00CL456 is activated, the initialization controller 10 outputs the initialization control signal DOUT_RSTB of a logic high level.

The output enable signals are activated in response to a rising DLL clock RCLK_DLL and a falling DLL clock FCLK_DLL. Further, in case that the CAS latency CL is three clocks, only the four output enable signals OE00, OE10, OE20, and OE 30 are activated. In case that the CAS latency CL is four clocks, the output enable signals OE00, OE10, OE20, OE30, and OE00CL456 are activated. The output enable signal OE00CL456 is activated between the output signal OE00 and the output signal OE10 and activated when the CAS latency CL is four, five, or six clocks. Meanwhile, the output enable signals OE40 and OE50 keep a logic low level when the CAS latency CL is three or four clocks. The output enable signal OE40 is activated when the CAS latency CL is greater than four clocks and the output enable signal OE50 is activated when the CAS latency CL is greater than five clocks. The output enable signals OE00 to OE50 are used for generating a plurality of read control signals ROUTEN, FOUTEN, QSEN_PRE, and QSEN. The number of the output enable signals OE00 to 0E00CL456 is determined by the CAS latency CL which has been already set by the mode register set (MRS).

The pipe latch block in accordance with above embodiment starts to resetting, i.e., initializing, the pipe latch unit 40 when all of the output enable signals OE00 to OE00CL456 become the logic low level.

Figure 8:
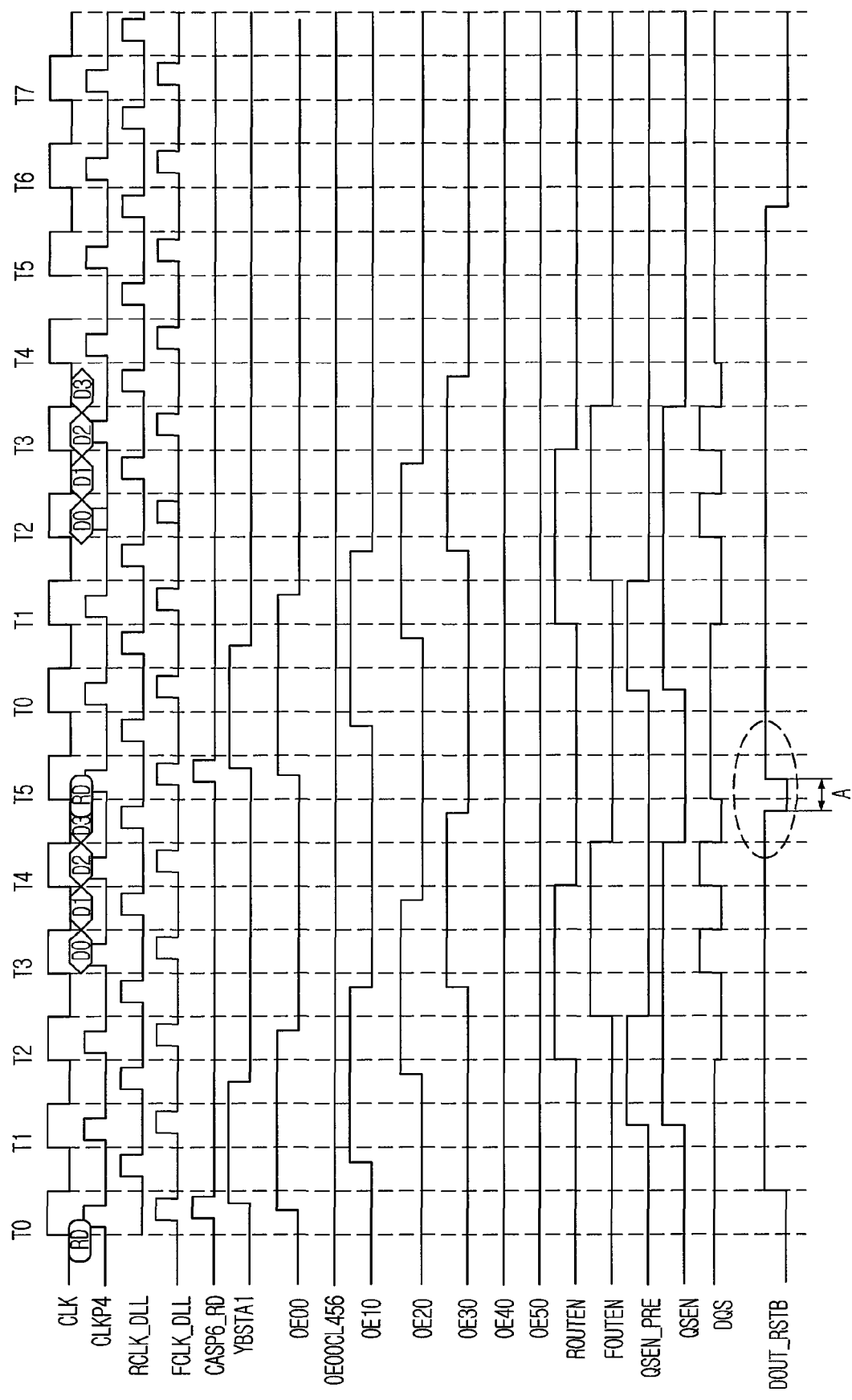
FIG. 8 is a timing diagram relating to the pipe latch block using the initialization controller shown in FIG. 3.

FIG. 8 is a timing diagram showing a problem of the pipe latch block using the initialization controller 10 shown in FIG. 3.

As shown in FIG. 8, when two consecutive read commands RD1 and RD2 are inputted, a time delay A between the activation of the output enable signal OE30 of the first read command RD1 and the activation of the output enable signal OE00 of the second read command RD2 is extremely short. That is, an activation sector of the initialization control signal DOUT_RSTB becomes short. As an operational frequency of the pipe latch block becomes higher, the activation sector of the initialization control signal DOUT_RSTB becomes shorter. Therefore, when the operational frequency of the pipe latch block is high, the initialization control signal DOUT_RSTB may not be correctly recognized. The pipe latch block may not properly and reliably operate.

Figure 9:
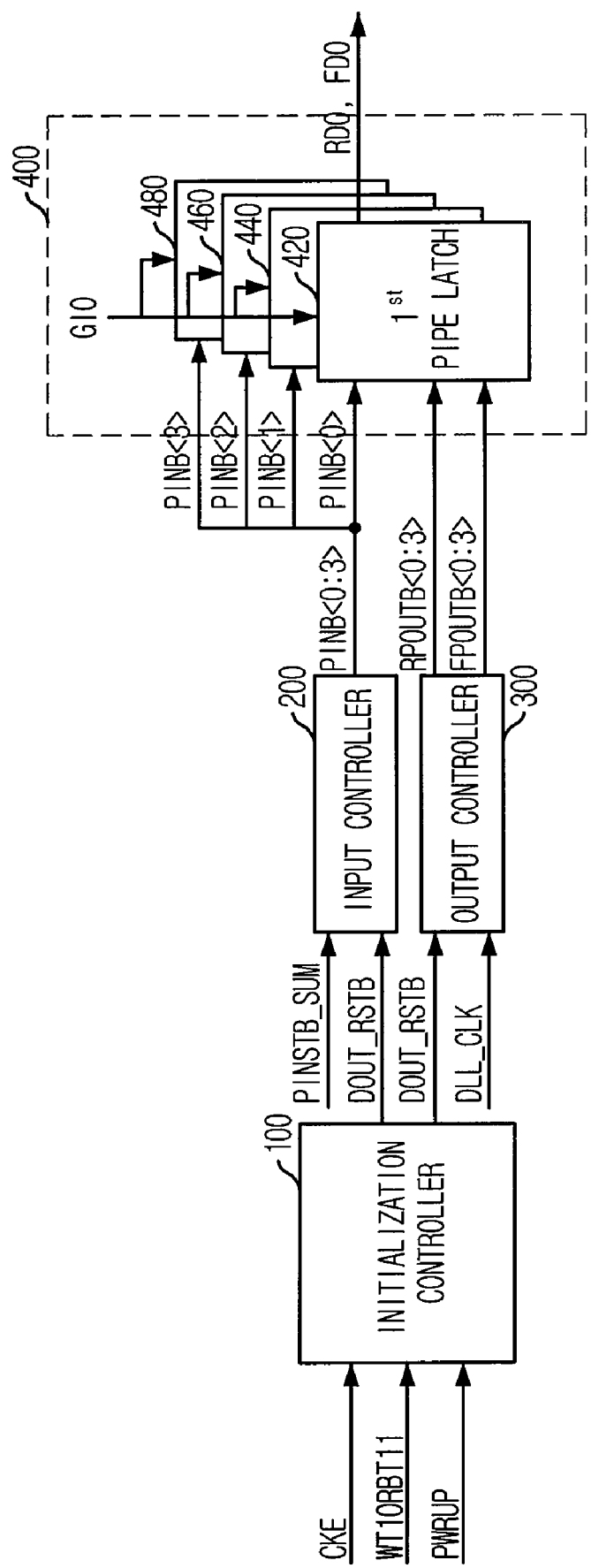
FIG. 9 is a block diagram describing a pipe latch block in accordance with an embodiment of the present invention.

FIG. 9 is a block diagram describing a pipe latch block in accordance with an embodiment of the present invention that avoids the abovementioned problem.

As shown in FIG. 9, the pipe latch block has similar circuitry to the pipe latch shown in FIG. 2 except that an initialization controller 100 receives a power-up signal PWRUP, a clock enable signal CKE, and a read/write flag signal WT10RBT11. The power-up signal PWRUP is inactivated as a logic high level after an internal voltage, e.g., a power supply voltage VDD is stabilized. The clock enable signal CKE has a logic low level during a power down mode. That is, the clock enable signal is activated during the power down mode. The read/write flag signal WT10RBT11 is activated as a logic high level in response to a write command WT and is inactivated as a logic low level in response to a read command RD.

In case of DDR2, the read/write flag signal WT10RBT11 becomes the logic high level after (WL-1) clocks pass from the inputting moment of the write command WT and becomes the logic low level after additive latency AL passes from the inputting moment of the read command RD. WL denotes write latency, i.e., a time delay between the inputting moment of the write command WT and the writing moment of valid data. In case of DDR2, WL=(RL−1)=(AL+CL−1). RL denotes a read latency, i.e., a time delay between the inputting moment of the read command RD and the outputting moment of valid data. The read latency RL is obtained by adding the CAS latency CL to the additive latency AL, i.e., RL=(AL+CL).

Figure 10:
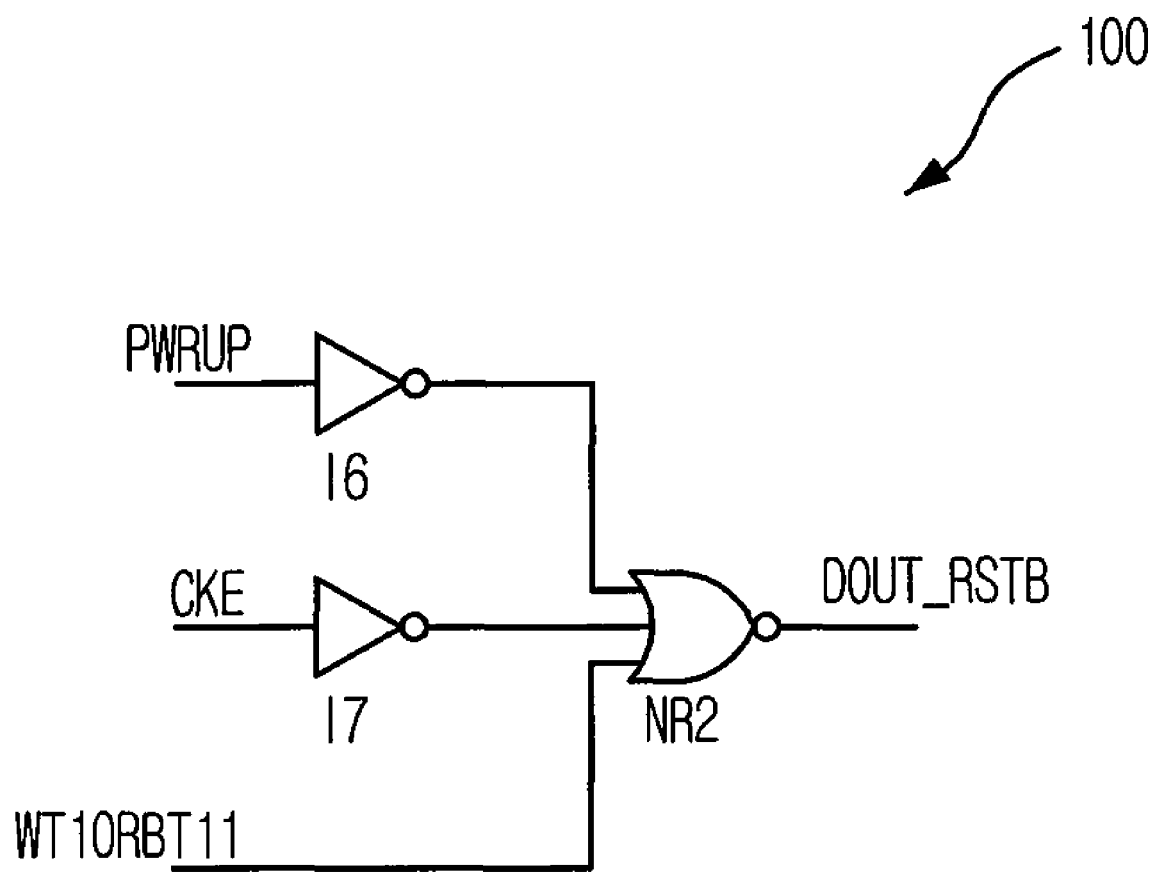
FIG. 10 is a schematic circuit diagram depicting an initialization controller shown in FIG. 9.

FIG. 10 is a schematic circuit diagram depicting the initialization controller 100 shown in FIG. 9.

As shown in FIG. 10, the initialization controller 100 includes a sixth inverter 16 for inverting the power-up PWRUP, a seventh inverter 17 for inverting the clock enable signal CLK, and a second NOR gate NR2 for receiving outputs of the sixth and the seventh inverters 16 and 17 and the read/write flag signal WT10RBT11 to thereby output an initialization control signal DOUT_RSTB. When the pipe latch block is in the power down mode or performs a write operation, the initialization control signal DOUT_RSTB becomes a logic low level in order to reset a pipe latch unit 400.

The other blocks including an input controller 200, an output controller 300, the pipe latch unit 400 shown in FIG. 9 are the same as those shown in FIG. 2 and perform the same operations and, thus, the detailed explanation about those blocks are omitted.

Figure 11:
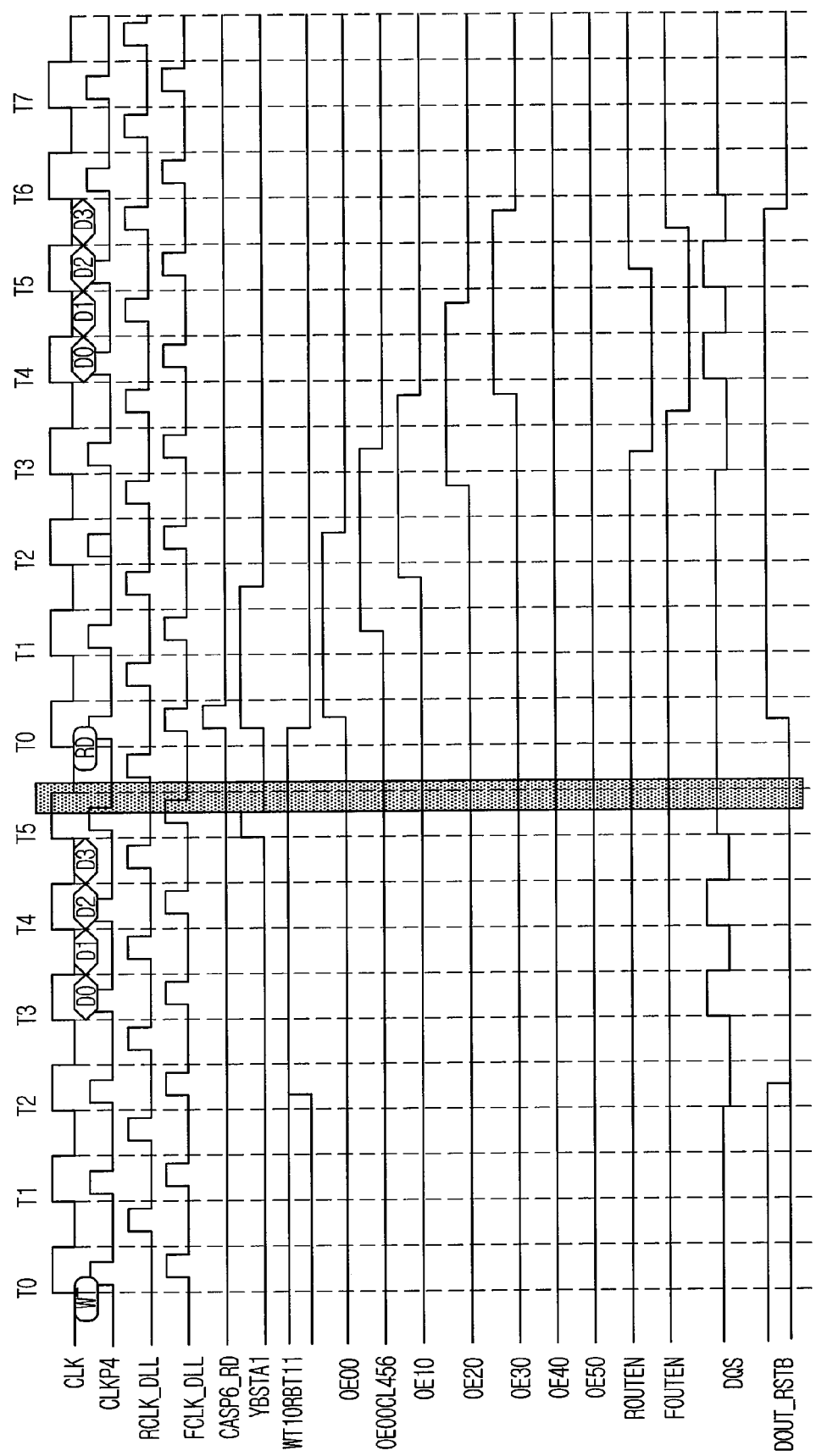
FIG. 11 is a timing diagram demonstrating an operation of the initialization controller shown in FIG. 10.

FIG. 11 is a timing diagram demonstrating an operation of the initialization controller 100 shown in FIG. 10.

FIG. 11 shows the operation of the initialization controller 100 in case that the CAS latency CL is four clocks, the additive latency AL is zero and, therefore, the read latency RL is four clocks and the write latency WL is three clocks.

Therefore, the read/write flag signal WT10RBT11 transits to the logic high level after about two clocks from the inputting timing of the write command WT. The initialization controller 100 outputs the initialization control signal DOUT_RSTB of the logic low level in response to the read/write flag signal WT10RBT11 of the logic low level. Accordingly, the input controller 200 and the output controller 300 output input control signals PINB<0:3> and output controls signals RPOUTB<0:3> or FPOUTB<0:3> of a logic high level, respectively. Therefore, pipe latches 420 to 480 included in the pipe latch unit 400 are turned off in response to the input control signals PINB<0:3> and the output control signals RPOUTB<0:3> or FPOUTB<0:3> of the logic high level.

After the write operation is closed and the read command RD is inputted, the read/write flag signal WT10RBT11 transits to the logic low level almost immediately because the additive latency AL is zero. The initialization controller 100 outputs the initialization control signal DOUT_RSTB of the logic high level in response to the read/write flag signal WT10RBT11 of the logic low level. Each pipe latch, e.g., 420, in the pipe latch unit 400 latches data loaded at the data line GIO in response to the input control signal PINB<0:3> of the logic low level outputs data stored in each of the pipe latches, e.g., 420, in response to the input control signals, e.g., RPOUTB<0>, of the logic low level.

The pipe latch block in accordance with the above embodiment of the present invention includes the initialization controller for resetting, i.e., initializing, the input controller and the output controller during the write operation. Therefore, the pipe latch reliably performs operations even though a plurality of read commands is consecutively inputted.

The present application contains subject matter related to Korean patent application No. 2005-090901 and No. 2005-128637, respectively filed in the Korean Patent Office on Sep. 29, 2005, and on Dec. 23, 2005. The entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a pipe latch unit including a plurality of pipe latches, for receiving data transmitted from a data line and latching data;
   an initialization controller for controlling the initialization of the pipe latch unit,
   wherein the initialization controller activates an initialization control signal when at least one of a power-up signal, a clock enable signal, and a read/write flag signal is activated, and
   the initialization controller includes,
   a first inverter for inverting the power-up signal,
   a second inverter for inverting the clock enable signal, and
   a NOR gate for receiving outputs of the first and the second inverters and the read/write flag signal to thereby output the initialization control signal.

2. The semiconductor memory device as recited in claim 1, further comprising;
   an input controller for controlling input timing of data transmitted from a data line to the pipe latch unit, and
   an output controller for controlling output timing of data latched in the pipe latch unit.

3. The semiconductor memory device as recited in claim 1, wherein the initialization controller initializes the pipe latch unit during a write operation.

4. The semiconductor memory device as recited in claim 1, wherein the initialization controller initializes the pipe latch unit during a power down mode.

5. The semiconductor memory device as recited in claim 1, wherein the power-up signal is inactivated after a power supply voltage is stabilized.

6. The semiconductor memory device as recited in claim 1, wherein the clock enable signal is activated during a power down mode.

7. The semiconductor memory device as recited in claim 1, wherein the read/write flag signal is activated in response to a write command and is inactivated in response to a read command.

8. The semiconductor memory device as recited in claim 1, wherein the read/write flag signal is activated after (WL-1) clocks pass from the inputting moment of a write command and is inactivated after additive latency passes from the inputting moment of a read command, wherein WL denotes write latency, i.e., a time delay between the inputting moment of the write command and the writing moment of valid data.

9. The semiconductor memory device as recited in claim 2, wherein the input controller includes:
   a first inverter chain for delaying a column clock signal which is activated after a read command is inputted;
   a plurality of input latch blocks, each of which transmits a corresponding input latch signal in response to the initialization control signal and an output of the first inverter chain; and
   a plurality of input control signal generators, each of which outputs the corresponding input latch signal as a corresponding input control signal in response to the initialization control signal and a delayed column clock signal.

10. The semiconductor memory device as recited in claim 9, wherein the output controller includes:
    a second inverter chain for delaying a delayed locked loop clock;
    a plurality of output latch blocks, each of which transmits a corresponding output latch signal in response to the initialization control signal and an output of the second inverter chain; and
    a plurality of output control signal generators, each of which outputs the corresponding output latch signal as an output control signal in response to the initialization control signal.

11. The semiconductor memory device as recited in claim 10, wherein each of the plurality of pipe latches includes:
    an input block for transmitting the data loaded at the data line in response to a corresponding input control signal;
    a first latch for latching the data transmitted from the input block;
    an output block for transmitting the data latched in the first latch in response to a corresponding output control signal; and
    a second latch for latching and outputting the data transmitted from the output block.

* * * * *